US006829598B2

(12) United States Patent
Milev

(10) Patent No.: US 6,829,598 B2
(45) Date of Patent: Dec. 7, 2004

(54) METHOD AND APPARATUS FOR MODELING A NEURAL SYNAPSE FUNCTION BY UTILIZING A SINGLE CONVENTIONAL MOSFET

(75) Inventor: Momtchil Mihaylov Milev, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 143 days.

(21) Appl. No.: 09/968,263

(22) Filed: Oct. 1, 2001

(65) Prior Publication Data

US 2002/0057606 A1 May 16, 2002

Related U.S. Application Data

(60) Provisional application No. 60/237,144, filed on Oct. 2, 2000.

(51) Int. Cl.[7] ............................ G06F 15/18; H03K 3/02; G11C 29/00
(52) U.S. Cl. ............................ 706/26; 706/33; 365/200
(58) Field of Search ...................................... 706/15–44

(56) References Cited

U.S. PATENT DOCUMENTS

| | | | |
|---|---|---|---|
| 5,027,171 A | | 6/1991 | Reedy et al. |
| 5,039,870 A | * | 8/1991 | Engeler ........................ 708/801 |
| 5,039,871 A | * | 8/1991 | Engeler ........................ 708/801 |
| 5,146,542 A | * | 9/1992 | Engeler ........................ 706/34 |
| 5,187,680 A | * | 2/1993 | Engeler ........................ 708/801 |
| 5,204,549 A | | 4/1993 | Platt et al. |
| 5,206,541 A | | 4/1993 | Boahen et al. |
| 5,253,196 A | | 10/1993 | Shimabukuro et al. |
| 5,254,889 A | | 10/1993 | Han |
| 5,331,215 A | | 7/1994 | Allen et al. |
| 5,336,936 A | | 8/1994 | Allen et al. |
| 5,442,209 A | | 8/1995 | Chung |
| 5,457,771 A | | 10/1995 | Imondi et al. |
| 5,479,578 A | * | 12/1995 | Engeler ........................ 706/34 |
| 5,546,504 A | | 8/1996 | Isoda et al. |
| 5,621,336 A | * | 4/1997 | Shibata et al. ................. 326/36 |
| 5,627,392 A | | 5/1997 | Diorio et al. |
| 5,704,014 A | | 12/1997 | Marotta et al. |
| 5,818,081 A | | 10/1998 | Ohmi et al. |
| 5,825,063 A | | 10/1998 | Diorio et al. |
| 5,864,235 A | | 1/1999 | Moritz et al. |
| 5,864,242 A | | 1/1999 | Allen et al. |
| 5,864,835 A | * | 1/1999 | Gorelik ........................ 706/33 |
| 5,895,460 A | * | 4/1999 | Gorelik ........................ 706/33 |
| 5,914,868 A | | 6/1999 | Han et al. |
| 5,914,894 A | | 6/1999 | Diorio et al. |
| 5,986,937 A | | 11/1999 | Yero |
| 6,023,422 A | | 2/2000 | Allen et al. |

OTHER PUBLICATIONS

Allen, Phillip E., CMOS Analog Circuit Design, 1987, pp.96–101, ISBN 0–19–510720–9, Oxfor University Press, Inc.N.Y.,U.S.A.

Haykin, Simon. Neural Networks A Comprehensive Foundation, 1999, pp.7–9,pp.10–15, ISBN 0–13–273350–1, Prentice Hall,Inc. N.J.,U.S.A.

* cited by examiner

Primary Examiner—Ramesh Patel
Assistant Examiner—Michael B. Holmes
(74) Attorney, Agent, or Firm—W. Daniel Swayze, Jr.; W. James Brady; Frederick J. Telecky, Jr.

(57) ABSTRACT

A method and apparatus for modeling a neural synapse function in analog hardware whereby the multiplication function inherent to the operation of a neural synapse is computed by applying a voltage on the gate-source terminals and an independent voltage on drain-source terminals of a MOSFET further using the resultant drain current of the latter device in non-saturation mode as function implementing a computation essentially close to multiplication function between the aforesaid voltages. Analog circuit is provided, capable of generating an output current signal which is proportional in magnitude, within a certain range, to a function computing essentially a sum of weighted input signals—products of corresponding pair of current input signal, and voltage control signal applied to a plurality of inputs thus capable of constructing an artificial neuron model.

16 Claims, 10 Drawing Sheets p-channel enhancement MOSFET n-channel enhancement MOSFET

METHOD AND APPARATUS FOR MODELING A NEURAL SYNAPSE FUNCTION BY UTILIZING A SINGLE CONVENTIONAL MOSFET

CROSS-REFERENCE TO RELATED APPLICATIONS

This application claims the benefit of U.S. Provisional Application No. 60/237,144 filed on Oct. 02, 2000.

STATEMENT REGARDING FEDERALLY SPONSORED RESEARCH OR DEVELOPMENT

Not Applicable

Reference to a "Microfiche Appendix"

Not Applicable

BACKGROUND OF THE INVENTION

1. Field of the Invention

The present invention relates to modeling the function of a neural synapse in hardware thus allowing for building of neural networks or alike learning and adaptive systems using low-power conventional MOSFETs integrated on-chip with other analog or digital application circuits.

2. Description of the Related and Prior Art

In spite of the immense advance in the development of the modem VLSI technology, digital circuits or systems reach the critical point from its computational speed and integration. In implementing real-time digital signal processing applications, the conventional VLSI technology has many limitations with regard to chip area and its speed, due to complexity of both hardware and software processing algorithms. On the other hand, artificial neural networks offer great potential in many applications. This poses the need of a simple, fast and efficient solution for implementation of such neural networks in a conventional CMOS fabrication technology along with the rest of the integrated circuit application. Such characteristics can be most often satisfied by the utilization of simple analog signal processing elements, in particular MOSFETs.

Prior efforts for single-MOSFET synapse circuits largely include use of floating gate MOSFET devices (for example: U.S. Pat. No. 6,023,422; U.S. Pat. No. 5,986,927; U.S. Pat. No. 5,914,894; U.S. Pat. No. 5,864,242; U.S. Pat. No. 5,825,063; U.S. Pat. No. 5,818,081; U.S. Pat. No. 5,627,392; U.S. Pat. No. 5,621,336; U.S. Pat. No. 5,457,771; U.S. Pat. No. 5,336,936; U.S. Pat. No. 5,331,215; U.S. Pat. No. 5,253,196; U.S. Pat. No. 5,204,549; U.S. Pat. No. 5,027,171) which utilize various structures and methods to store/remove electrical charges on/from a floating gate or node through insulator by tunneling (Fowler-Nordheim) or hot-electron-injection. Beside the many advantages that those structures offer, they rely on conditions that are hard to meet in a conventional CMOS fabrication process. For example, at the voltages and oxide thicknesses used in conventional silicon MOS processing, the tunneling probability is exceedingly small, likewise hot-electron-injection requires much higher electric fields and supply voltages than normal. The latter is in direct conflict with the tendency of lowering supply voltages with the constant decrease of the device geometries and increase of the scale of integration.

Other related prior art includes analog multipliers build by coupled current mirrors (U.S. Pat. No. 5,914,868), four-quadrant square-law circuits (U.S. Pat. No. 5,864,255) or pair of MOSFETs and a symmetrical voltage source (U.S. Pat. No. 5,254,889) all capable of removing non-linear current component in one form or another to improve multiplier linearity. Some solutions utilize voltage-current conversion circuits employing differential pair of MOS transistors (U.S. Pat. No. 5,704,014) or current controlled current conveyor circuits (U.S. Pat. No. 5,206,541). There are also solutions to use multiple-bit-split MOSFET gates (U.S. Pat. No. 5,442,209). It should be mentioned that this list is not in any way comprehensive or inclusive and does not represent the complete scope and class of search for prior art performed by the inventor. For sake of briefness, herein will not be mentioned quite innovative solutions for building artificial neural networks as, for example, "Information processing device capable of optically writing synapse strength matrix" (U.S. Pat. No. 5,546,504) in which a matrix of plurality of neurons is realized through a combination of a light-emitting and light-receiving functions of two overlapping molecular films. The above-related art is mentioned in order to point out that most of the solutions require special integrated circuit technology, show performance dependencies as to the quality or the technology parameters of the used fabrication process or require special ambient (for UV floating-gate programming for example). Therefore, in general practice, those solutions do not allow for easy on-chip integration with other integrated circuit applications implemented on most widely used conventional CMOS processes.

Naturally, it is desired to provide a simple single-transistor synapse for modeling neural synaptic connection function and for building artificial neural networks in VLSI integrated circuits, which offers following advantages and features:

1. use of a single, conventional MOSFET to model a neural synapse function;
2. low power consumption;
3. independence of the model quality with regard to quality of the CMOS fabrication process;
4. simplicity and feasibility to dense integration;
5. preferred conventional CMOS implementation which allows for integration with conventional analog and digital IC applications;
6. current signal input and output allowing for straightforward and easy multi-layer neural network interconnection, simple synapse-output summing, avoidance of parasitic capacitive effects on both input and output transient signals therefore allowing for faster processing in real-time applications;

This and other features of the invention will be apparent to a person of ordinary skill in the art from the description of the invention contained herein.

Terms and Definitions

Specification description of the claimed invention and disclosure will be facilitated by the definition of the meaning of the following terms. Term definitions given herein are intended to help in limiting redundancy and unduly multiplication of terms in the disclosure and should be used to better comprehend the spirit and scope of the invention. The definitions given are not intended to limit and define the scope of the appended claims rather than to provide antecedent support of a claim in cases where such support can be more easily found by the interpretation of the terms given herein and used in the disclosure, or in cases where these definitions help avoid inconsistencies between claim and specification disclosure or prior art, should such arise.

Neural synapse—although 'neural' refers to a biological synaptic connection formed between a dendrite tree and axon terminal of a neuron (most often cerebral pyramidal cell), herein it should be most often interpreted as artificial synapse model, mathematical or functional abstract of its biological counterpart. Synapse, neural synapse or synaptic connection will most often be used interchangeably in the application.

Synapse strength or weight—the quantity that can be used to show the degree of proportion between the quantity used to represent pre-synaptic activity (input stimulus) and the quantity representing post-synaptic activity (weighted input stimulus).

Neural synapse function—although biological synapse function comprises functions of excitation or inhibition to effectively strengthen or weaken the transmission of a pre-synaptic signal to a post-synaptic signal and also learning functions (to keep or adjust its strength with respect to synaptic activity), herein, a synapse function should be interpreted as the multiplication function between the pre-synaptic signal quantity and synapse strength (or weight) quantity employed in the computational model most often used to describe the synapse.

Neuron—most often should be interpreted as functional abstract model of its biological counterpart. The latter model comprises of a linear combiner producing a sum of weighted input stimuli, further processed by a non-linear activation function, of sigmoidal or hard-limiting type, applied to limit the amplitude of the neuron output activity potential.

Neural network—a collection of interconnected neurons where a neuron input is either connected to previous layer neuron's output or receives input stimulus from an input node. Since the type or actual connectivity structure is immaterial to the present invention no further definition of neural network types and connectivity patterns will be given herein.

SUMMARY OF THE INVENTION

It is an object of the present invention to provide a method for modeling a neural synapse in hardware, using VLSI technology. More specifically, a method utilizing a single conventional MOSFET to model a neural synapse by effectively computing the product of an input signal (pre-synaptic activity) represented by gate-source voltage of latter MOSFET with synapse strength (or weight) represented by the drain-source voltage of same MOSFET.

Another object of the present invention is to provide a high-performance neural network synapse circuit operating in low voltage level range as a particular embodiment, allowing for variable weight setting ($v_{DS}$ voltage) while keeping the latter independents within certain operational range, from the synapse output (post-synaptic) signal ($i_D$ current).

In accordance with an aspect of the present invention, there is provided as prior art a first-order approximation of large-signal, low-frequency computational model describing a MOSFET in non-saturation region of operation and, as part of the object of the invention described herein, is presented the use of the above to model the multiplication function of a synapse. It should be noted that the presented model considers DC operating mode of operation or operation at analog signal frequencies as low as to keep the validity of relationships shown and practically render frequency dependent terms or effects insignificant. However, this does not limit the applicability of the model since in most cases this condition can be satisfied during consecutive short time periods of processing intervals.

In accordance with an aspect of the present invention, there is provided a neural network synapse comprising: a single conventional MOSFET with applied gate-source voltage as input signal, applied drain-source voltage as weight control signal; a preferred embodiment of an artificial neuron comprising a: synapse current input; synapse output current summing node; weight control circuit; neuron response current output.

BRIEF DESCRIPTION OF THE DRAWINGS

The novel features believed characteristic of the present invention, as well as other features and advantages thereof, will become apparent to those of ordinary skill in the art and best understood by reference to the following detailed description of the particular embodiment, read in conjunction with the accompanying drawings listed herein.

DETAILED DESCRIPTION OF THE INVENTION AND PREFERRED EMBODIMENT

The essence of the invention herein will be obvious to those of ordinary skill in the art after examining related computational equations on which the invention is based. Further below, the preferred embodiment of the present invention will be explained with reference to the accompanying drawings.

I. Method

Figure 1:
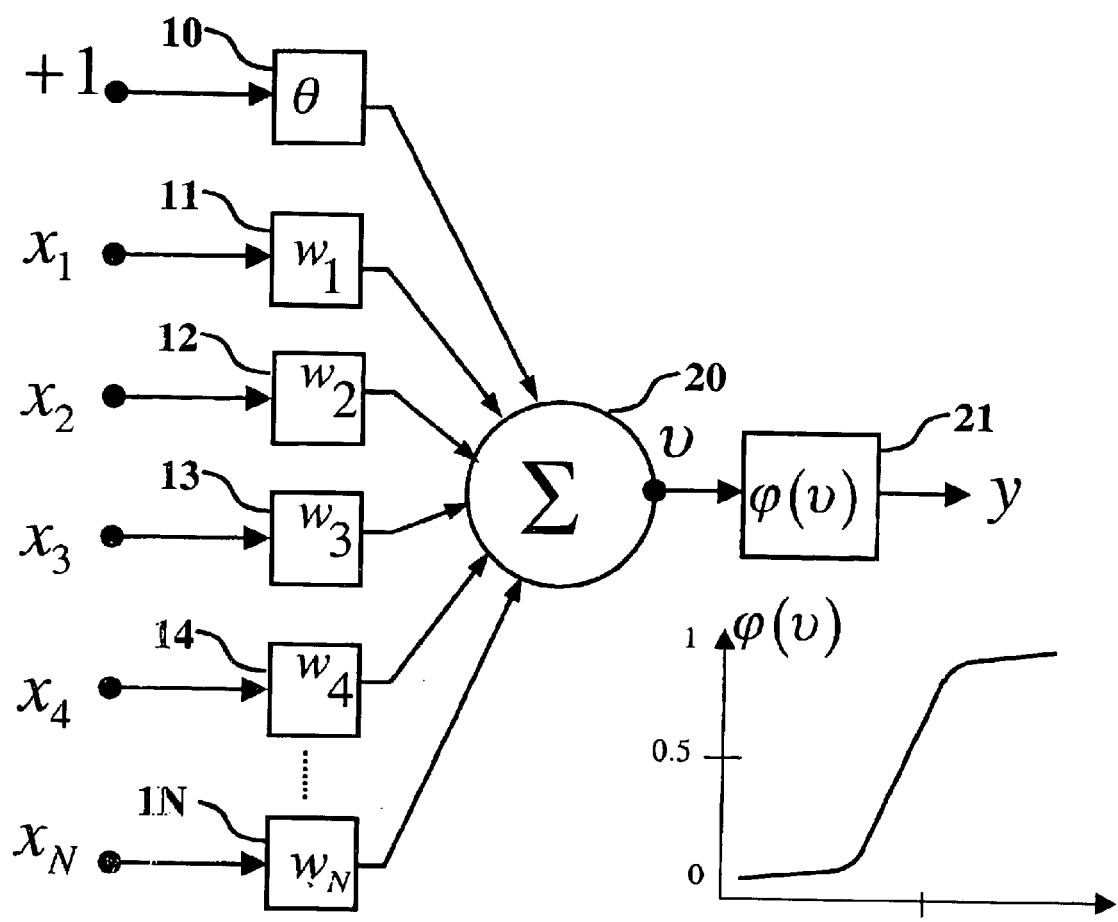
FIG. 1 is a diagram of the most commonly used computational model of artificial neuron referred herein as prior art.

The well-known in the art input-output relation of the "linear combiner" (20), essential part of the computational model of a neuron with N-number of synapses shown on FIG. 1 is given by:

$$v = \sum_{k=1}^{N} w_k x_k \quad (1.1)$$

where $x_k$ is the k-th input vector component (representing pre-synaptic activity signal quantity for synapse k) and $v$ is the output of the linear combiner or so called "induced local field" or activation potential value. Synapse weights or strengths denoted with $w_k$ for each synapse k are shown on FIG. 1 as (11),(12) ... (1N). Further, typically, such a model will have some type of limiting non-linear function (21) applied to limit neuron's output activity:

$$y = \varphi(\upsilon) = \varphi\left(\sum_{k=1}^{N} w_k x_k + \theta\right) \quad (1.2)$$

Since $\phi(\upsilon)$, typically sigmoidal function, is most "sensitive" around the origin of the $\upsilon$-axis, additional free parameter $\theta$ is used to "adjust" the neuron's induced local field to be in that vicinity at least during initial stages of training. This parameter is adjusted ("trained") usually along with all of the free-parameters $w_k$ (weights), which are adjusted according to the "error signal" computed at the output y. Parameter $\theta$ is often adjusted along with the rest of the weight parameters and is considered as an additional neuron synaptic connection with constant input value of +1. Therefore it will not be considered as a separate from weight coefficients entity in the remainder of the disclosure.

Figure 2:
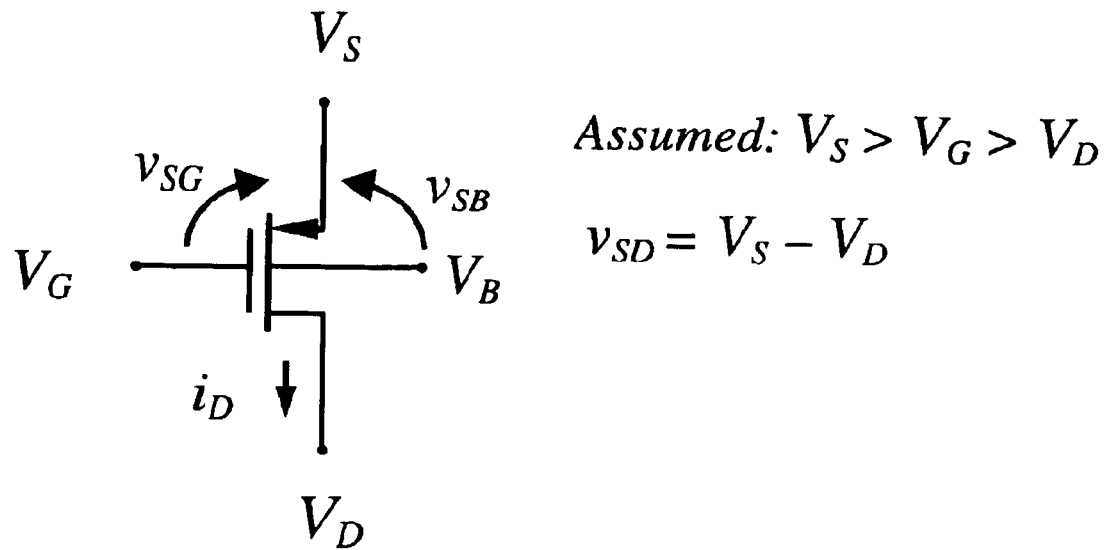
FIG. 2 is a view showing symbols of n-channel and p-channel MOSFETs along with the used herein positive current and voltages definition for applied terminal voltages.
Figure 2:
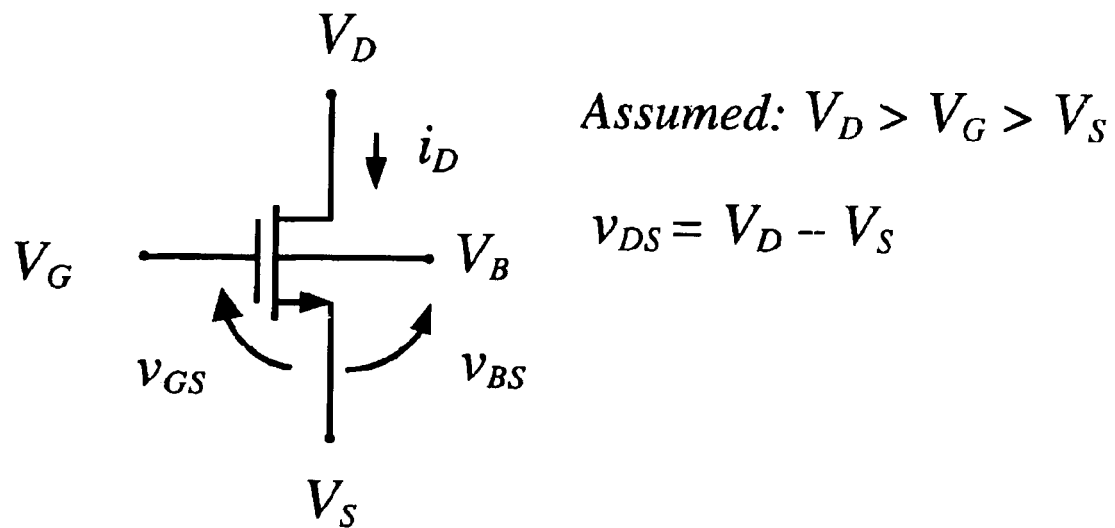

Referring now to FIG. 2 and the given as prior art first-order-approximated large-signal low-frequency model of a MOSFET drain current (assuming non-saturation region of operation)

$$|v_{GS}| > |V_{TH}| \text{ and } |v_{DS}| \leq |v_{GS} - V_{TH}|: \quad (1.3)$$

$$i_D = \beta\left[(v_{GS} - V_{TH}) - \frac{v_{DS}}{2}\right]v_{DS}(1 + \lambda v_{DS})$$

Wherein:

$$\beta \triangleq \mu \cdot C_{OX} \frac{W}{L}$$

is the process and geometry dependent transconductance parameter comprising:
$\mu$—electron/hole channel carrier mobility,
$C_{OX}$—thin oxide layer gate unit capacitance per area, $$\frac{W}{L} -$$

MOSFET gate/channel geometry ratio; and,
$\lambda$—is channel-length modulation effect parameter of said MOSFET;
as is shown next, there is a way to model a neural synapse function described by the partial products $w_k x_k$ in Eq. (1.1) by using relationship in Eq. (1.3).

By ignoring the last term in Eq. (1.3), due to very small values of $\lambda$ (typical values of 0.004 to 0.01) and, as further seen, relatively small $v_{DS}$, Eq. (1.3) is rewritten in the following form:

$$i_D \simeq \beta(v_{GS} - V_{TH})v_{DS} - \frac{1}{2}\beta v_{DS}^2 \quad (1.4)$$

Object of the described invention herein, the product of the gate and drain-source voltages is used to produce each of the partial products of relationship Eq. (1.1), then summing the output currents of those partial products for all synapses yields the complete "sum of weighted products" in Eq. (1.1).

Considering a single synapse k and denoting:

$$\tilde{\upsilon}_k \triangleq i_D,$$

$$x_k \triangleq \beta(v_{GS} - V_{TH}),$$

$$w_k \triangleq v_{DS}$$

a single synapse induced local field value can be written as:

$$\upsilon = x_k w_k + \zeta w_k^2 \quad (1.5)$$

wherein $\zeta$ is constant, and $$\zeta \triangleq -\frac{1}{2}\beta.$$

It should be emphasized that several different notations can be used to re-write relationship in Eq. (1.3) into the form of Eq. (1.5), where $\zeta$ is constant, which all should be considered equivalent in the spirit of the invention as long as quantity $x_k$ is directly proportional to $v_{GS} - V_{TH}$, $w_k$ is directly proportional to $v_{DS}$ and $\upsilon_k$ is directly proportional to $i_D$. For a neuron with N-number of synapses, Eq. (1.5) yields the overall induced local field value:

$$\tilde{\upsilon} = \sum_{k=1}^{N} \tilde{\upsilon}_k = \sum_{k=1}^{N} x_k w_k + \zeta \sum_{k=1}^{N} w_k^2 \quad (1.6)$$

assuming $\zeta$ i.e. $\beta$ is same for all synapse modeling MOSFETs.

Comparing Eq. (1.1) to Eq. (1.6), object of the present invention, it is found that the non-linearity error introduced by the square term in the latter equation can be considered insignificant with respect to the essential functional ability of the model described originally by Eq. (1.1) provided that following conditions are satisfied:
(a) synapse modeling MOSFET must be in non-saturation mode of operation,
(b) values of magnitude of quantity x are chosen in a range as larger as practical than the values of magnitude of quantity w.

To evaluate the above statement, examining the non-linearity error introduced by the square term in Eq. (1.6) will be very useful. The latter error, for a single synapse k, can be defined as:

$$\varepsilon_{lin} = \frac{\tilde{\upsilon}_k - \upsilon_k}{\upsilon_k} = \zeta \frac{w_k}{x_k} = -\frac{1}{2} \frac{v_{DS}}{v_{GS} - V_{TH}} \quad (1.7)$$

where $$\upsilon_k \triangleq w_k x_k$$

is the ideally linear local induced field value for the considered k-th synapse and $\upsilon_k$ is the value modeled by the merit of Eq. (1.5). By inspection following conclusions are drawn:
(a) the error is independent of $\beta$ (independent of MOSFET geometry and technology process constants)
(b) the error could be minimized, theoretically, by minimizing $\zeta$, except that in the case disclosed if $\beta$ is decreased, $v_{GS} - V_{TH}$ should be increased accordingly to keep quantity x from decreasing as well.

(c) the error is minimized by choice of low threshold voltage for synapse modeling MOSFET.
(d) the smaller the drain-source voltage and the greater the "effective" gate-source voltage is, less the linearity error is and more linear relationship in Eq. (1.5) becomes,
(e) although relationship in Eq. (1.5) is squarely non-linear with respect to weight quantity it is linear with respect to input stimulus quantity, therefore by a choice of a low voltage range for weight quantity, the error is minimized.

It should be noted that the last two conditions are in perfect accord with the condition of non-saturation mode of operation of the synapse modeling MOSFET set for Eq. (1.3). In addition, examining a typical value for this error brings sense as to its relevance. Typical values of the quantities in Eq. (1.7): $v_{DS} \leq 100$ mV, $v_{GS}-V_{TH} \cong 2$ to 1V result in $\in_{lin} \leq 1$ to 5%.

Consequently, by the merit of relationship in Eq. (1.5), a single MOSFET device offers good potential and yields a rather simple method for modeling a synapse function in hardware.

II. Apparatus

Figure 3:
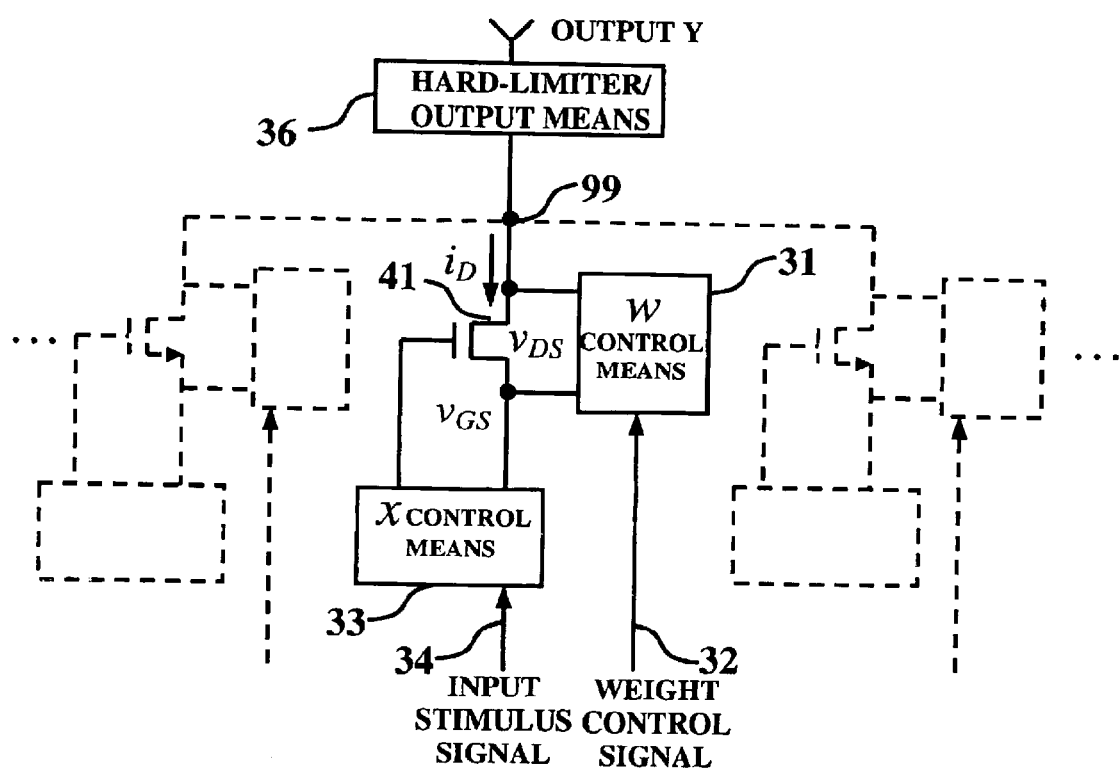
FIG. 3 is a circuit block diagram of a MOSFET used as a synapse in the preferred embodiment of an artificial neuron capable of having any number of synaptic connections; a single MOSFET device is used to model each synaptic connection by effectively multiplying the input gate-source voltage signal and the drain-source voltage (synaptic weight value). Note: on this figure doted-line blocks show neighboring synapse means to illustrate the way the rest of synapses are connected following the same pattern.

Further, a preferred embodiment, being another object of the current invention is explained by referring to FIG. 3. As described, the essence of the given hardware solution is a single conventional MOSFET device (41) to model each synaptic function of an artificial neuron. The voltage across the source and drain regions of (41) determines the weighting or the synaptic strength by means of weight control means (31) and signal (32), gate-source voltage of (41) represents the input stimulus (34) applied to that synaptic connection either by an input signal at that node or by previous-layer neuron's output and is controlled by input means (33). The resulting drain current through (41) representing the induced local field of that particular synaptic connection is then summed up along with all of the activity signals induced in the rest of the neuron's synapses at node (99). Finally, the overall activity signal (total activation potential) is processed through a non-linear (sigmoidal or hard-limiting) function (36) to generate neuron's output signal.

Figure 4:
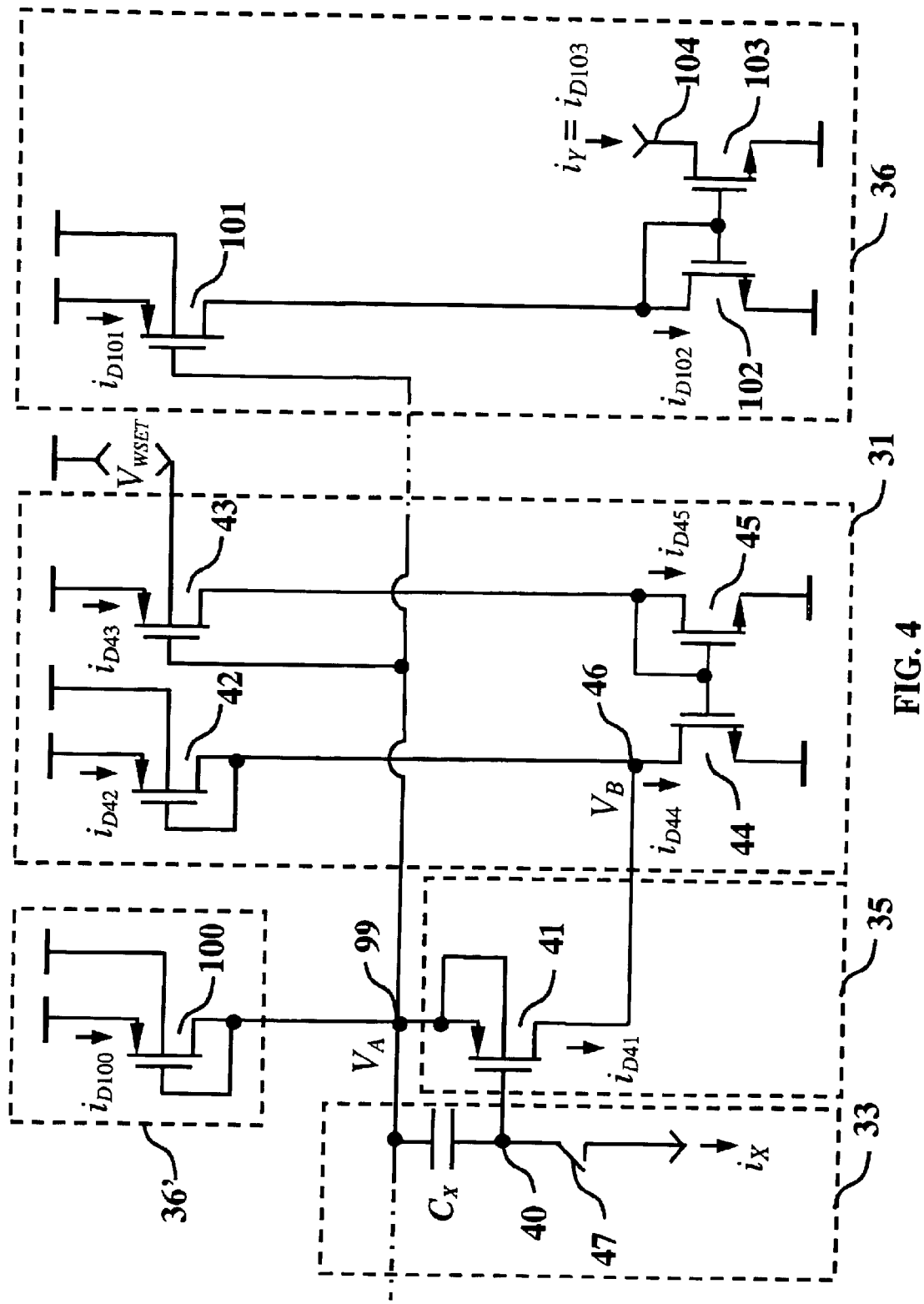
FIG. 4 is a detailed circuit diagram displaying a neural network synapse, object of the invention, along with the accompanying circuits providing the current input means, weight control means, summing node and neuron's overall current output means according to the described embodiment of the present invention.

Latter described preferred embodiment of the present invention is shown next in more detail on FIG. 4. Herein, for the purpose of an example, an n-well CMOS process is considered. Since the n-channel MOSFETs (44),(45),(102) and (103) are inherently built in the p-substrate, their bulk terminals will be assumed to be all at ground potential and will not be drawn. Terminal voltages and currents for both n-channel and p-channel MOSFETs use positive sign convention shown as prior art on FIG. 2.

The embodiment shown on FIG. 4 comprises: a current-voltage converter input means (33) formed by capacitor $C_X$ between nodes (99) and (40) and a current switch (47); synapse modeling means (35) utilizing p-channel MOSFET (41); all-synaptic-activity current summing common node (99) and a common for all synapses active-resistor load (36') by a p-channel MOSFET (100); weight control means (31) comprising a current mirror formed by n-channel MOSFETs (44) and (45), active-resistor load formed by p-channel MOSFET (42) matched with (100), a p-channel MOSFET (43) forming a current mirror with (100); a common for all synapses current output means (36) comprising p-channel MOSEFT (101) forming another current mirror with (100), and a current mirror sink source on n-channel MOSFETs (102) and (103). In the shown embodiment, (100), (42), (43) and (101) are all-matched-parameters MOSFETs. Herein, a circuit with one synapse connection (model) is considered, and then the applicable conclusions are generalized for a circuit having more than one synapse modeling means. This assumes means (33),(35) and (31) are implemented for each synaptic connection modeled while means (36) and (36') remain common for all synapse connections.

The above-described circuit operates as follows. Constant with time input current $i_X$ (produced by a current sink source of an output stage similar to (36) or formed in the neural network inputs) is integrated into a linearly time-dependent voltage (applied as gate-source voltage $v_{SG41}$ on (41)) for a certain period of time $T_C$ for which the switch (47) is closed:

$$v_{SG41} = v_{C_X}(T_C) = \frac{1}{C_X}\int_0^{T_C} i_X \, dt = \frac{1}{C_X} i_X \cdot T_C \quad (1.8)$$

Therefore the resulting voltage in Eq. (1.8) is linearly proportional to the input current $i_X$. After period of time $T_C$ the current switch (47) is opened and remains opened for the rest of the computational interval under consideration. The voltage on $C_x$ applied on the gate-source terminals of the MOSFET (41) remains essentially constant being subject to discharge only by the leakage currents of (41) and (47). The latter voltage forms said $x_k$ quantity in Eq. (1.5). "Synapse" current $i_{D41}$ of (41) will be finally determined by the applied drain-source $v_{SD41}$ between nodes (99) and (46) forming synapse weight $w_k$ in Eq. (1.5). Said $v_{SD41}=V_A-V_B$ is determined by the difference of $\sqrt{i_{D42}}-\sqrt{i_{D100}}$ through matched active-resistor loads (42) and (100):

$$V_A = V_{SS} - v_{SD100} \approx V_{SS} - \sqrt{\frac{2i_{D100}}{\beta_{100}}} - V_{TH100} \quad (1.9)$$

$$V_B = V_{SS} - v_{SD42} \approx V_{SS} - \sqrt{\frac{2i_{D42}}{\beta_{42}}} - V_{TH42} \quad (1.10)$$

where $V_{SS}$ is the most positive supply voltage potential applied at the sources of (100),(42),(43) and (100); $V_{TH42}=V_{TH100}$ are the threshold voltages of MOSFETs (100) and (42) respectively, and $\beta_{42}=\beta_{100}$ are the transconductance parameters of matched parameters pair (100) and (42).

Subtracting Eq. (1.10) from Eq. (1.9) results in:

$$V_A-V_B=\sqrt{2/\beta}(\sqrt{i_{D42}}-\sqrt{i_{D100}}) \quad (1.11)$$

where $$\beta \triangleq \beta_{42} = \beta_{100}.$$

Hence, by controlling said currents difference, $V_A-V_B$ and respectively connection weight quantity $w_k$ of the modeled k-th synapse is controlled. The resulting current $i_{D41}$ of this synapse MOSFET (41) is then summed up at node (99) along with the drain currents of the remaining synapse modeling MOSFETs (not shown) connected to the common node (99) in the same way as MOSFET (41):

$$i_{D100} = \sum_{k=1}^{N} i_k = i_{D41} + \ldots \quad (1.12)$$

where $i_{D100}$ current represents total synaptic current output for all N-number of synapse-modeling MOSFETs like (41).

In order to provide constant difference of potentials $V_A$ and $V_B$, independent of both local synapse current (for example $i_{D41}$) and neuron's overall synapse current $i_{D100}$ respectively, it is further shown that $i_{D42} \approx i_{D100}$ is required.

The latter is achieved by weight control means (31) comprised of p-channel MOSFETs (42), (43) and coupled n-channel MOSFET (44) and (45). Means (31) build effectively a follower for changes in $V_A$ by tracking changes of $i_{D100}$. Since $i_{D43}=i_{D100}$ by the virtue of current mirror (100)-(43), current $i_{D44}$ results in:

$$i_{D44}=m \cdot i_{D45}=m \cdot i_{D43}=m \cdot i_{D100} \quad (1.13)$$

where m is (44)-(45) current mirror ratio. Further, by expressing:

$$i_{D41}=p \cdot i_{D100} \quad (1.14)$$

where p is a quantitative scalar number satisfying $0 \leq p \leq 1$ which represents $i_{D41}$ as fraction of $i_{D100}$, current $i_{D42}$ is written as:

$$i_{D42}=i_{D44}-i_{D41}=m \cdot i_{D100}-p \cdot i_{D100}=(m-p) \cdot i_{D100} \quad (1.15)$$

Thus, it is obvious to one of ordinary skill that, current $i_{D42}$ is proportional to overall synaptic activity current $i_{D100}$. Circuit DC operating point and current mirror ratio m are chosen such that, within a certain region of operation, $(m-p) \approx 1$ i.e.

$$i_{D42} \approx i_{D100} \quad (1.16)$$

This further leads to:

$$\frac{dV_A}{di_{D100}} \approx \frac{dV_B}{di_{D42}} \quad (1.17)$$

It is also fortunate that Eq. (1.16) leads to very small $V_A-V_B$ which is in perfect agreement with aforementioned requirement to minimize non-linearity error defined in Eq. (1.7).

Regarding the choice of m, it will become apparent to one of ordinary skill, that it should satisfy $$1 < m \leq 2 \quad (1.18)$$

and that it is dependent on the number of synapse connections modeled (MOSFETs connections to node (99)). For instance, for one synapse, apparently p=1, therefore m≈2 should be implemented so that Eq.(1.16) and Eq.(1.17) are true. As number of synapse connections increases (number of synapse modeling MOSFETs connected to (99) increases), obviously, p is becoming smaller for each synapse and m should decrease to keep m−p≈1. In the extreme case where number of synapses increases to infinity, p→0 and m→1 accordingly. Thus it is concluded that m is inversely proportional to the number of synaptic connections modeled and a possible general rule that governs the choice of m can be written as:

$$m \approx 1 + \frac{1}{N} \quad (1.19)$$

where N is the number of synapses modeled by the circuit shown on FIG. 4.

Still, in the interest of the present invention is also the ability to offset $V_B<V_A$ by a small amount such that to produce the desired $v_{SD41}=V_A-V_B$ i.e. quantity $w_k$ respectively. The latter can be achieved, in the suggested embodiment, by offsetting the back-gate of (43), employing the body-effect to offset the threshold voltage $V_{TH43}$ of (43) thus effectively offsetting also $i_{D43}$ from $i_{D100}$ This is done by the introduction of a small control voltage $V_{WSET}$ which should satisfy $V_{WSET}<<V_{THSUB}$ where $V_{THSUB}$ is the threshold voltage at which the n-channel MOSFET bulk-substrate junction becomes forward-biased and significant current flows into the substrate.

Finally, the current output means (36) construct a current mirror between the neuron load (100) and (101) to provide output current proportional to the sum of all synaptic output currents summed at node (99) without affecting said synaptic currents (as $i_{D41}$ or overall synaptic current $i_{D100}$). The latter also provide a current sink source (102 and 103) compatible with the design of the current input(s) (like 33) of the described synapse(s) to allow for easy interconnection. It should be noted that, although, means (36) do not implement any specific hard-limiting function, as shown in this embodiment, it is inherent property of the circuit implemented by (101),(102) and (103) that it will, in fact, limit the overall circuit output due to two main factors:

(a) devices (101) or (103) go out of saturation mode of operation, and
(b) the circuit node voltages are ultimately limited by the power supply voltage range.

It must be noted that the implementation of specific hard-limiting or sigmoidal type output processing means is not object of the disclosure herein neither specific output processing means, other that the one mentioned above, are claimed as part of the invention. Such means can be easily added and implemented by any person ordinarily skilled in the art without need to modify the circuit disclosed herein or depart from the spirit of the invention.

III. Experimental Validation Data

Data disclosed on FIGS. 5 through 11 is believed useful with respect to utility requirement of 35 U.S.C 101 and 112, first paragraph and with respect to credibility by establishing evidence of record of a working example as related to MPEP 2107 second section.

Figure 5A:
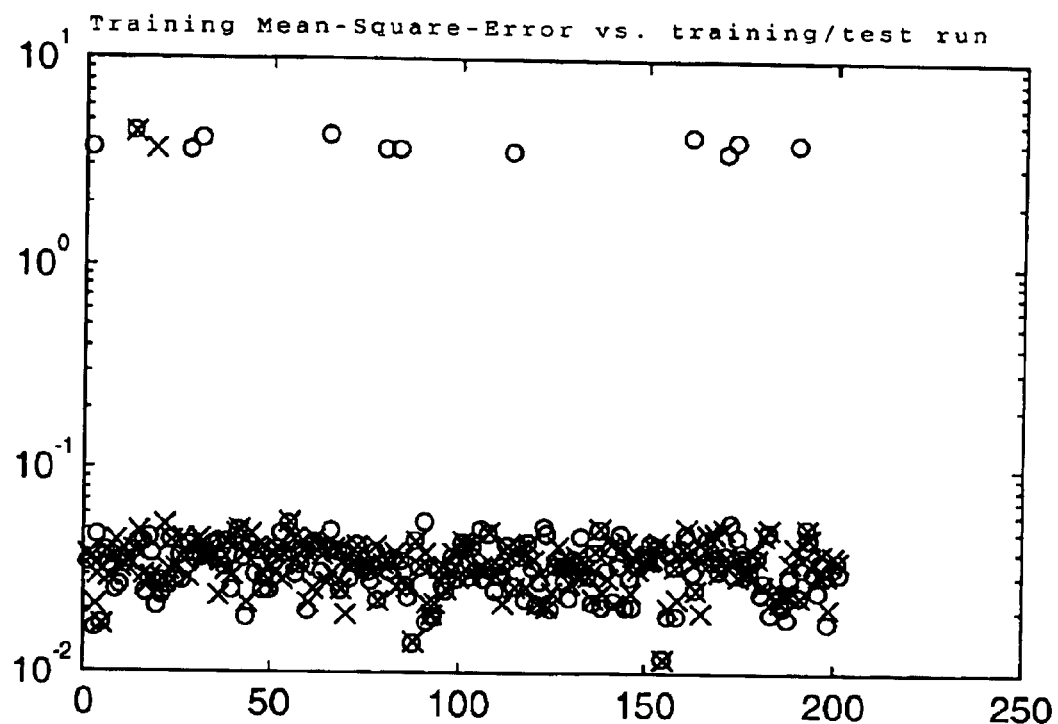
FIGS. 5 through 7 show results of computer simulations of an artificial neuron with two inputs and one output (two synapses) modeled by means of Eq. (1.6) trained and tested as linear classifier over a random sets of 2-D linearly separable data vectors.
Figure 5B:
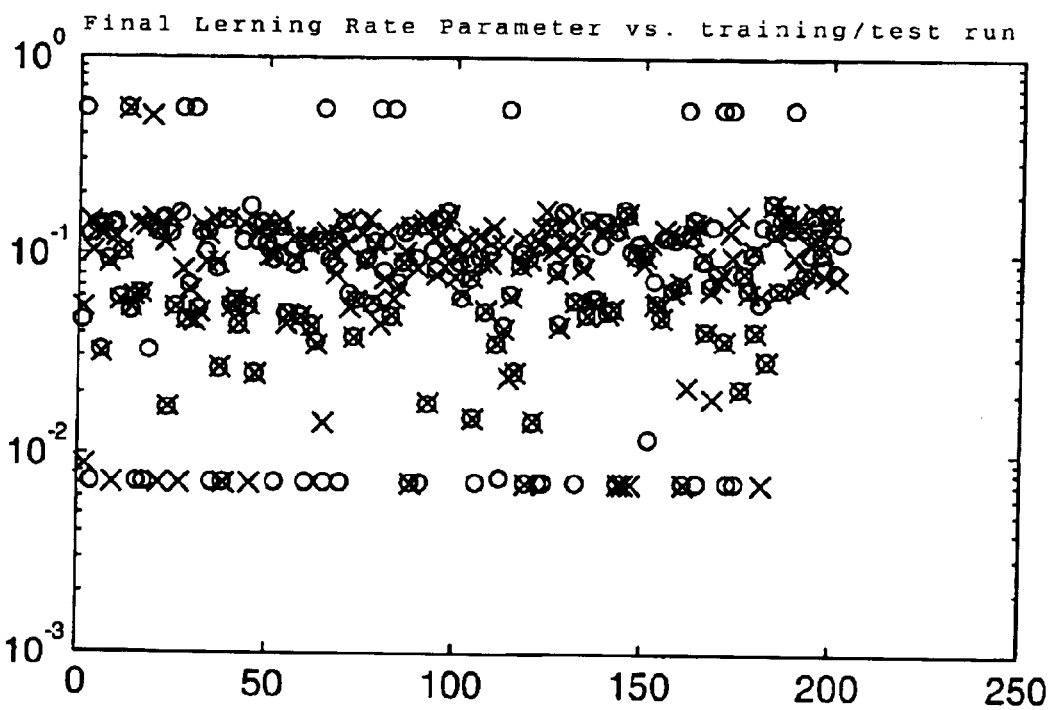
Figure 6A:
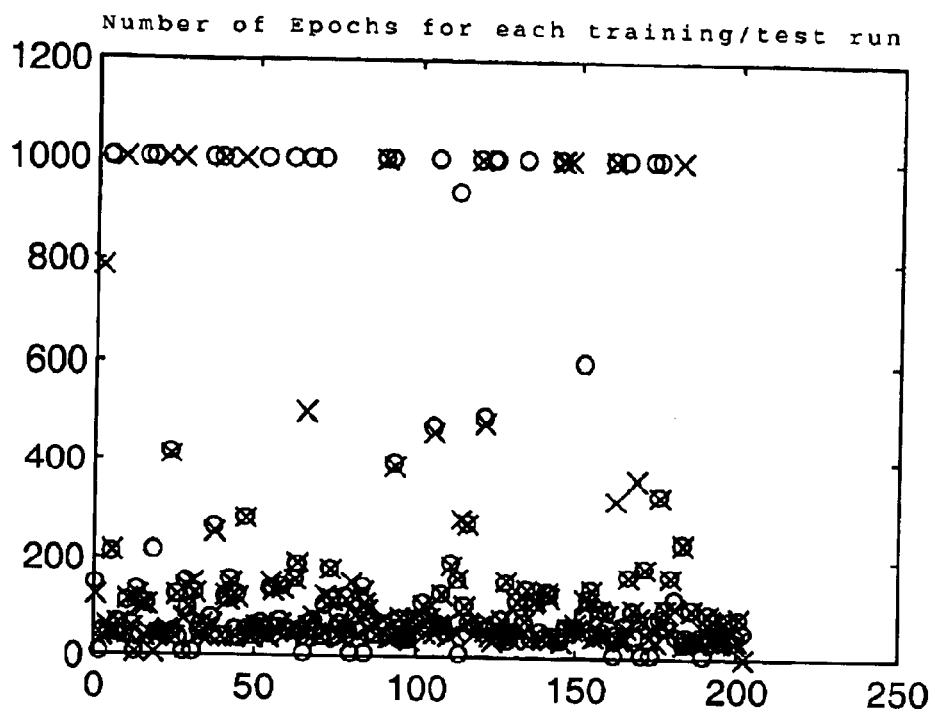
Figure 6B:
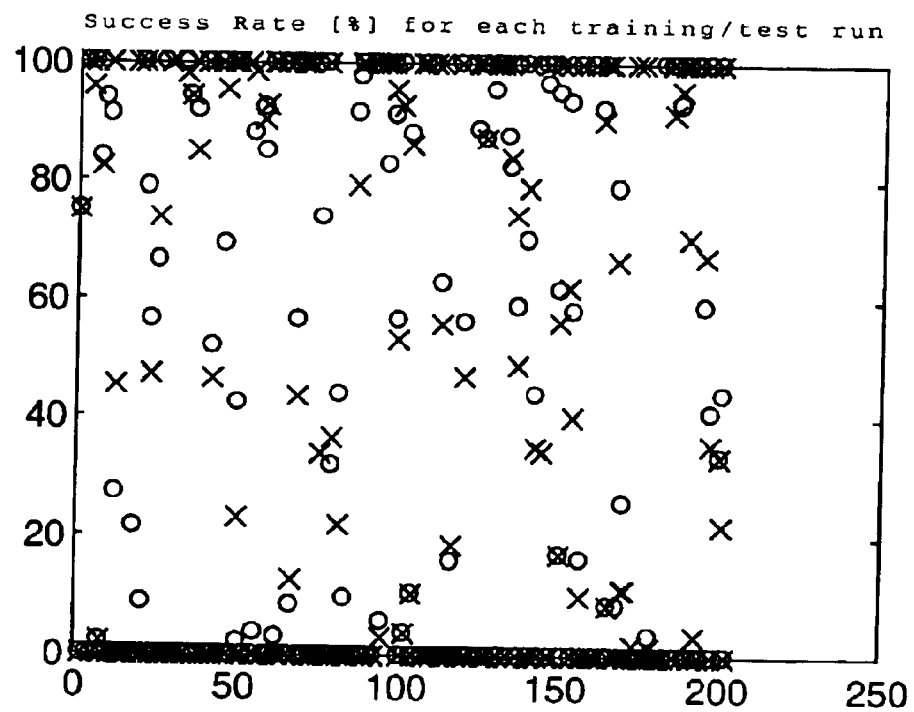
Figure 7:
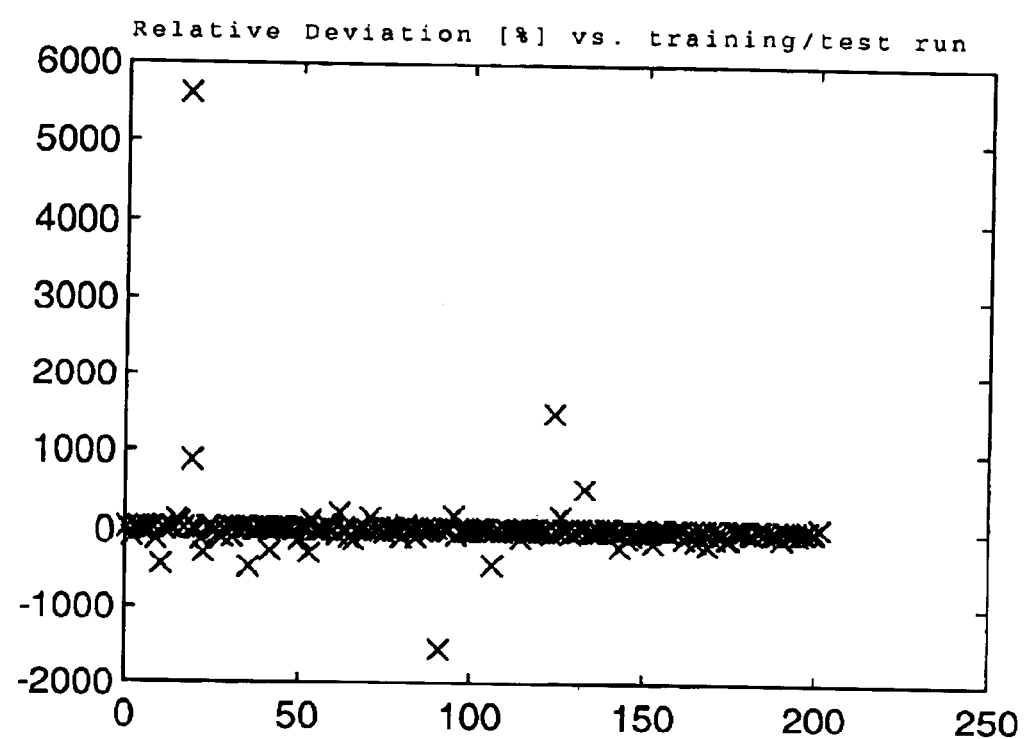

As mentioned in the brief description of the drawings, FIG. 5 through 7 show results of computer simulations of an artificial neuron with two inputs and one output (two synapses) modeled by means of (1.6) trained and tested as linear classifier over a random sets of 2-D linearly separable data vectors. Results given herein are based on 200 random data runs, for each of which first the original model of a neuron with ideally linear synaptic connections based on (1.1) is trained and tested (data designated with a circle), then another model of the same neuron employing a synaptic connections modeled with inherent non-linearity according to (1.6), object of the present invention, is trained and tested (data designates with a cross) and the results are plotted on common plots to facilitate their analysis and comparison. More specifically:

FIGS. 5A and 5B show each run Mean-Square-Error (MSE) of neuron's response while learning over the training set of data and the Final Learning Rate (FLR) parameter value. These two characteristics give a measure of how well the neuron is learning to classify the two sets of data. It is obvious that both neurons perform very much alike and very well with MSE of, typically, less than 0.05 and FLR of about 0.1.

FIG. 6A shows a measure of how quickly each of the tested neuron models is learning. Again, it is observed that the performance between the two models is, practically, the same and both models, typically, finish their learning in about or less than 200 epochs.

FIG. 6B shows the success rate of correct classification during a test-run over the learned set of data for each model.

As seen on the plot, the success rate is either localized around complete failure/success or almost evenly distributed in-between this range. What is important to notice is that the two models again appear to have quite indistinguishable distributions i.e. their performance is practically indistinguishable.

FIG. 7 shows "Deviation from reference" error-measured as the relative difference between the response of a neuron simulated with synaptic connections as in Eq. (1.6) and the response of an ideally linear neuron model over the same set of data. As shown, typically, this error is very minimal.

What is construed from the simulation result log files (not included in the disclosure for briefness) and simulation plots (shown) is that the model including non-linearity error is performing not worse that the original model in most cases and even better in some cases with respect to faster convergence possibly due to larger updates to the weights without compromising stability.

Figure 8:
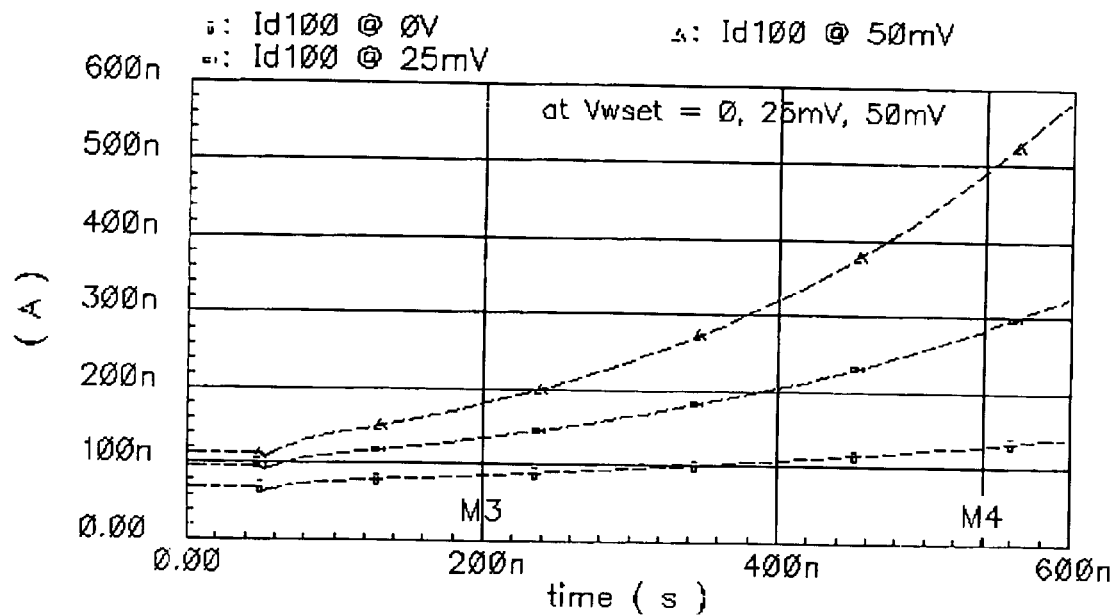
FIGS. 8 through 10 show voltage and current plots of computer circuit simulation results of the circuit shown on FIG. 4. These plots serve to illustrate the essential behavior of the circuit disclosed in the specification as the best mode believed to carry out the invention.
Figure 8:
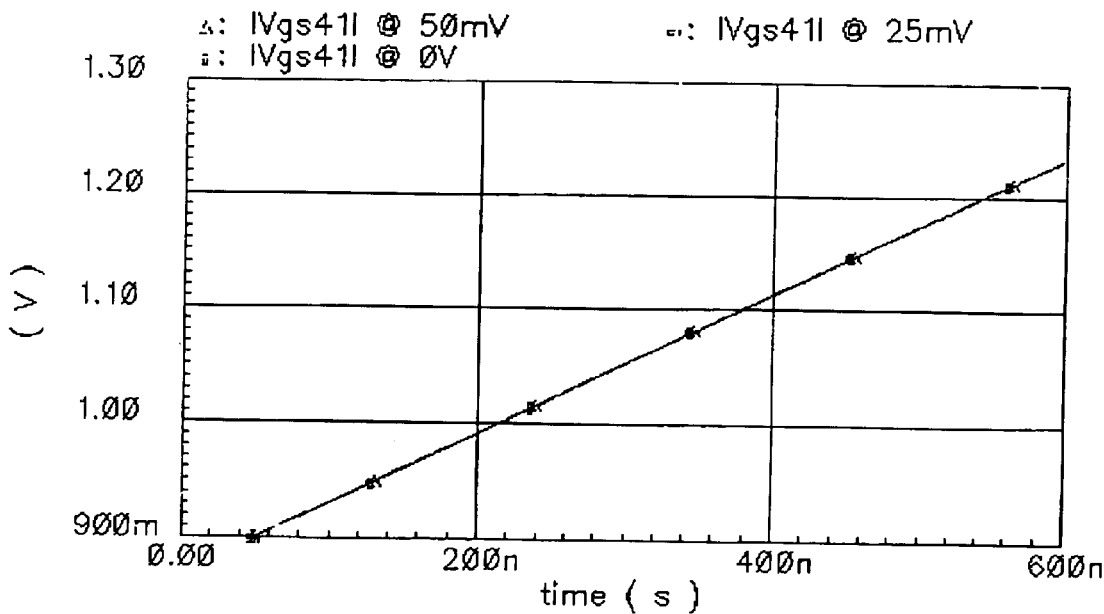

FIG. 8 shows I–V curves of the synapse drain current ($i_{D41}$) through MOSFET (41) versa gate-source voltage on same MOSFET (representing synapse pre-synaptic/input stimulus) where the family of curves are plotted for different values of source-drain voltage (same MOSFET) representing synapse connection weight. Note that, this plot applies to the circuit on FIG. 4 which is a single-synapse neuron (as shown) and thus, the current shown $i_{D100}=i_{D41}$ which does not limit the generality of the results. Shown transient data is in response to a linear-dependent increase in source-gate voltage as shown on the lower half diagram on FIG. 8.

Figure 9:
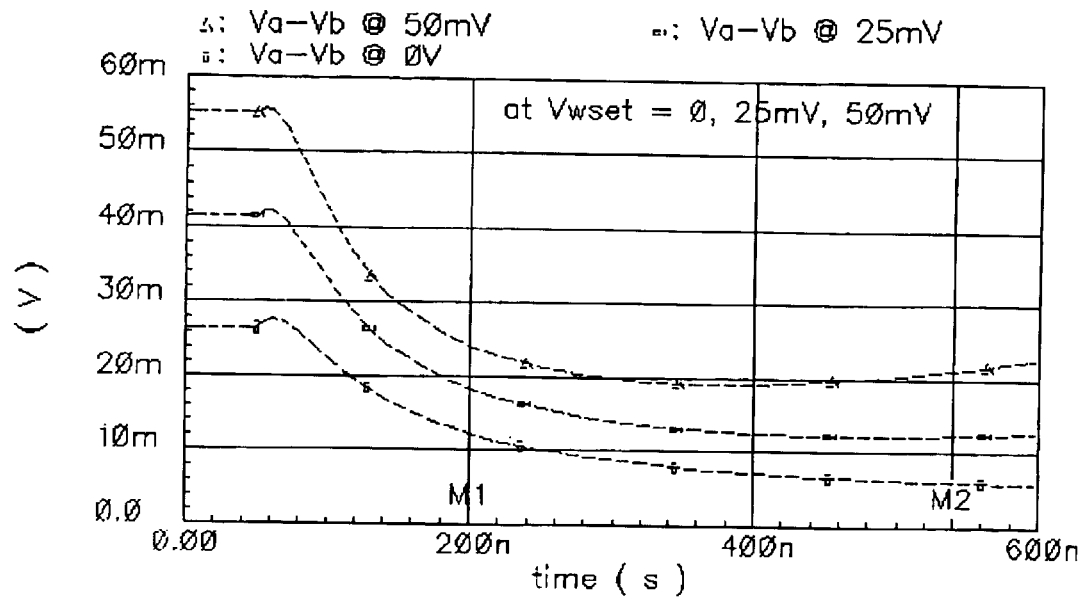
Figure 9:
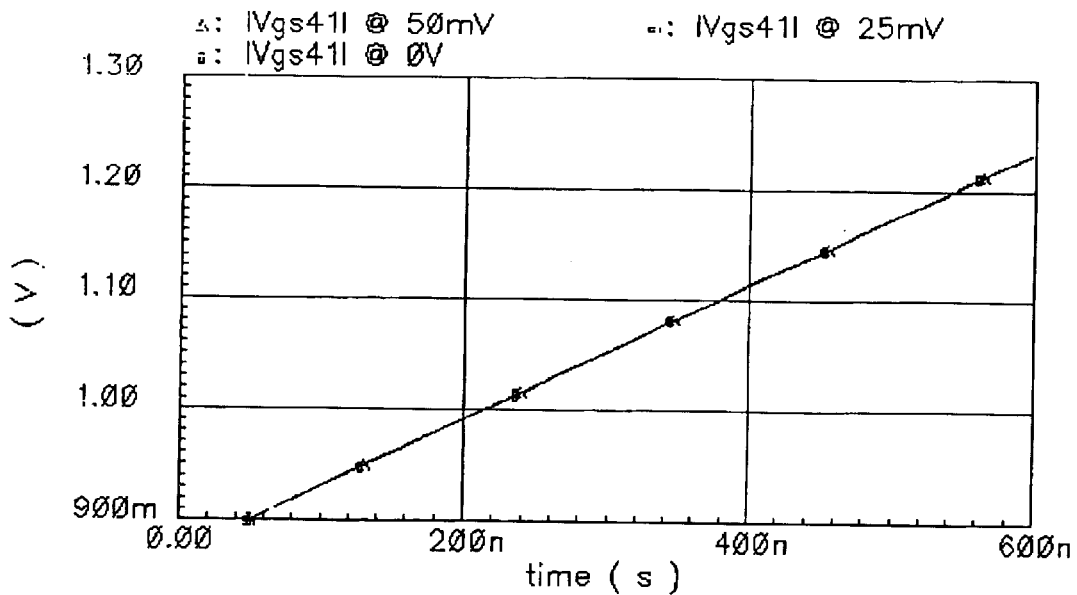

FIG. 9 depicts curves of voltage difference on nodes (99) and (46)—voltage $V_A-V_B$, determining synapse connection weight, versa pre-synaptic stimulus represented by gate-source voltage on MOSFET (41). The family of three curves are for three different $V_{WSET}$ voltages which control the absolute value of $V_A-V_B$. It is shown how the mentioned voltage difference remains, essentially, constant over a certain range (between markers M1–M2).

Figure 10:
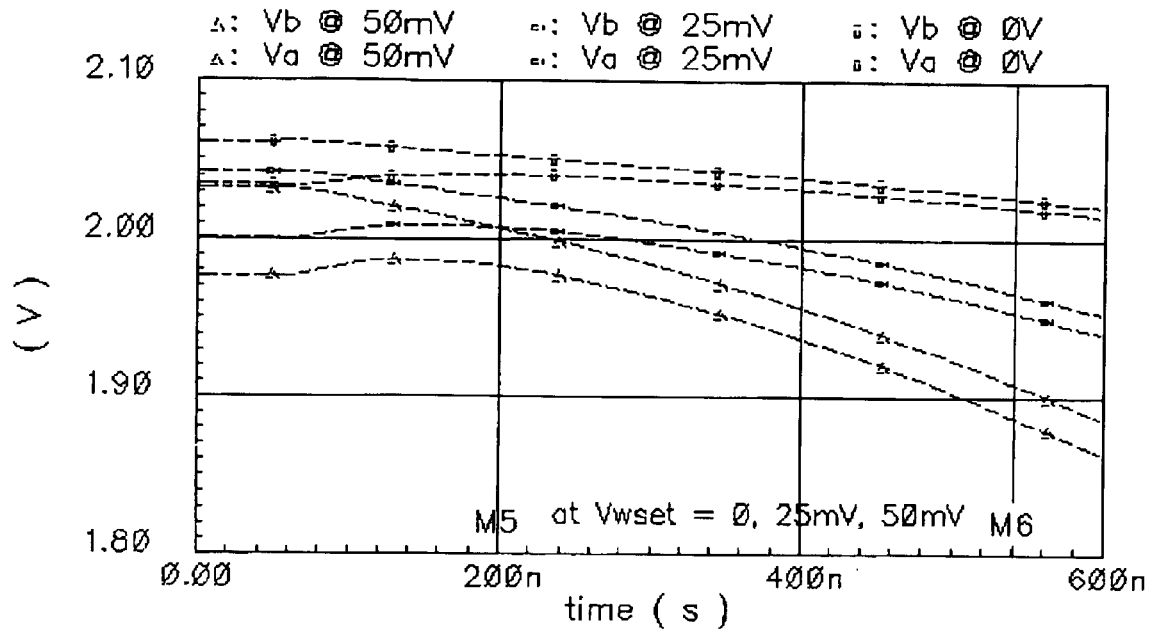
Figure 10:
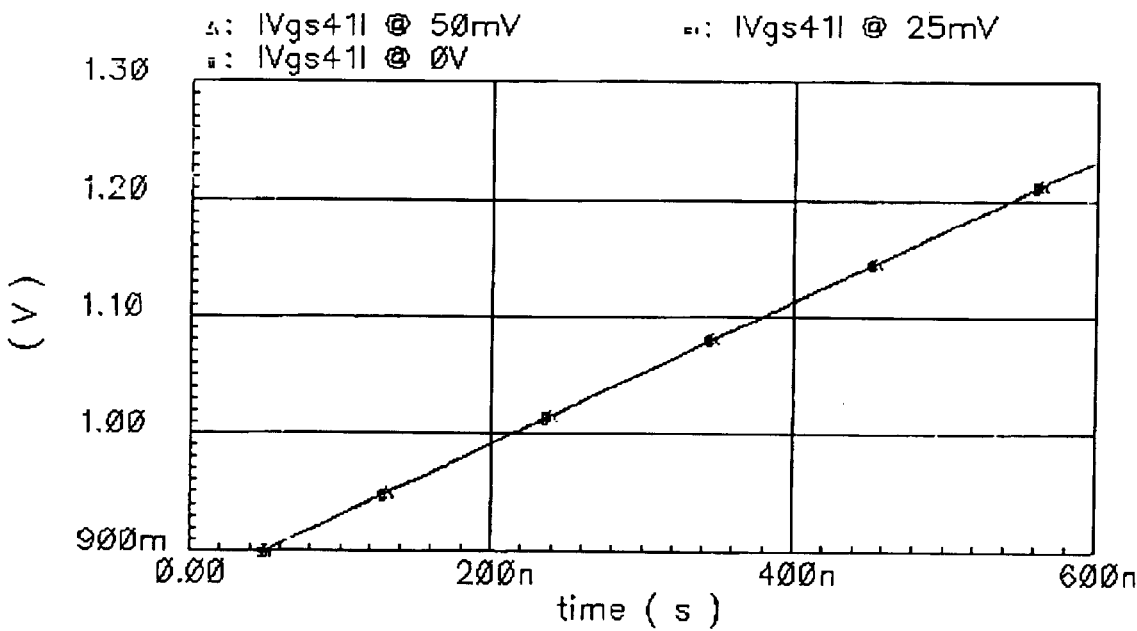

FIG. 10 shows voltage potentials $V_A$ and $V_B$, this time separately, where the family of curves are shown again for different values of weight-control signal $V_{WSET}$. This diagram demonstrates the operation of weight-control means (31) and the ability to compensate for changes in drain current ($i_{D41}$) and voltage $V_A$ respectfully by keeping $V_{SD41}=V_A-V_B$ essentially constant over a certain range (between markers M5–M6).

IV. Conclusion

As apparent from the above description and considerations, the present invention provides a method and apparatus to model a neural network synapse multiplication function, by using low supply voltages and utilizing conventional VLSI CMOS fabrication technology. Thus, the present invention provides for a simplification and on-chip integration of the neural network applications with other analog or digital applications, by means of only five conventional MOSFETs per synapse, while the synapse function itself, more specifically, is modeled by means of only a single MOSFET device.

It should be emphasized that the present invention is not limited to the particular embodiment disclosed herein as the believed best mode contemplated for carrying out the present invention, but rather that the disclosed method to use a single conventional MOSFET to model a neural synapse multiplication function may have many variations within the spirit and the scope of this invention except as limited and defined in the appended claims.

What is claimed is:

1. A method for modeling a neural synapse in hardware by computing a synapse multiplication function between an input pre-synaptic stimulus applied to said neural synapse and synapse strength, wherein:

said multiplication function is approximated, to be non-linear with respect to synapse strength function and described by:

$$\upsilon = x \cdot w + \zeta \cdot w^2,$$

wherein:

quantity $\upsilon$ denotes a synapse induced local field due to input stimulus, quantity x denotes said input pre-synaptic stimulus, quantity w denotes connection strength or weight of said synapse, and $\zeta$ is a constant independent of the above quantities.

2. The method as in claim 1, wherein said approximation to be said non-linear with respect to synapse strength function is computed by analog means of a single conventional metal-oaxide-semiconductor-field-effect-transistor (MOSFET) wherein:

said multiplication function is computed by said transistor large-signal drain current relationship, and said transistor is in non-saturation mode of operation, wherein:

said input pre-synaptic stimulus is represented by an analog quantity proportional to gate-source voltage of said MOSFET, said a apse strength or weight is represented by an analog quantity proportional to drain-source voltage of said MOSFET, said synapse as local induced field is represented by an analog quantity proportional to said drain current of said MOSFET.

3. The method as in claim 1, wherein said multiplication function is minimized down by a choice of range for variation of said quantity x with respect to said quantity w, or by minimizing the constant $\zeta$.

4. The method as in claim 2, wherein said multiplication function is minimized down by a choice of range of variation of said gate-source voltage with respect to said drain-source voltage such that said drain-source voltage is significantly smaller than said gate-source voltage, or by a choice of smaller threshold voltage of said MOSFET.

5. An apparatus including a conventional CMOS technology electronic circuit to model a neural synapse allowing for interconnection with other circuits operable to construct on artificial neuron model with synaptic connections useful in building of artificial neural networks in integrated circuits by, computing a synapse multiplication function between the input pre-synaptic stimulus applied to said synapse and synapse strength, wherein:

said multiplication function is approximated, to be non-linear with respect to synapse strength function described by:

$$\upsilon = x \cdot w + \zeta \cdot w^2,$$

wherein:

quantity $\upsilon$ denotes a synapse induced local field due to input stimulus, quantity x denotes said input pre-synaptic stimulus, quantity w denotes connection strength or weight of said synapse, and $\zeta$ is a constant independent of the above quantities.

6. An apparatus as in claim 5 comprising:
synapse multiplication function computing means further comprising a single MOSFET operating in linear, non-saturation mode;
synapse input means for setting gate-source voltage of a said first MOSFET in proportion to a synapse pre-synaptic stimulus signal;
synapse weight control means for setting voltage drop across drain and source terminals of said MOSFET in proportion to a synapse connection strength (weight);
means maintaining said voltage across source and drain terminals of said MOSFET independent of said MOSFET drain current; and
synapse output means producing output signal equal or proportional to said MOSFET drain current wherein said output current represents said synapse induced local field value.

7. An apparatus as in claim 6, wherein said pre-synaptic stimuli are DC or slowly varying analog electrical current input signals and said neuron output signal is a DC or slowly varying analog electrical current signal.

8. An apparatus as in claim 7 comprising:
a common for all synapses nodes;
one or more synapse circuits each further comprising:
synapse computing means comprising a single first MOSFET operating in linear, non-saturation mode of operation having a source and bulk terminals both connected to said common node;
synapse input means for setting gate-source voltage of said first MOSFET in response proportion to input current signal, wherein
said gate-source voltage representing said input pre-synaptic stimulus value;
synapse weight control means for setting a voltage drop across drain and source terminals of said first MOSFET in proportion to a weight control signal wherein
said drain-source voltage represents synapse strength (or weight) value;
means for maintaining said voltage across source and drain terminals of said first MOSFET independent of said first MOSFET drain current;
output means for producing output current proportional to said first MOSFET drain current wherein said output current represents synapse induced local field value being essentially equal to said pre-synaptic stimulus value effectively multiplied by said synapse weight or strength value according.

9. An apparatus as in claim 8, wherein said input means comprise of:
a capacitor having a positive plate terminal being connected to said first MOSFET source terminal and a negative plate terminal being connected to said gate terminal of said first MOSFET;
a controlled switch means to control the time period during which said synapse input current is applied to said negative terminal of said capacitor to form said first MOSFET gate-source voltage.

10. An apparatus as in claim 9, wherein said synapse weight control means and means for maintaining said voltage across drain and source terminals of said first MOSFET independent of said first MOSFET drain current comprising:
a second MOSFET, being active load, having a source terminal connected to most-positive supply voltage rail, gate and drain terminals each of which connected to drain of said first MOSFET, and a bulk-terminal connected to most positive supply voltage rail;
a third MOSFET having a gate terminal connected to said common node that is source terminal of said first MOSFET, a source terminal connected to most-positive supply voltage rail, a drain connected to drain and gate terminals of a fifth MOSFET, and a bulk terminal connected to means supplying a small offset voltage with respect to source of said third MOSFET;
a fourth MOSFET having a drain terminal connected to said second MOSFET drain and gate terminals and also connected to said first MOSFET drain terminal, a source and bulk terminals both connected to ground supply rail;
said fifth MOSFET, forming a current mirror with said fourth MOSFET, having a drain and gate terminals both connected to gate terminal of said fourth MOSFET and to drain terminal of said third MOSFET, a source connected to ground supply rail, and a bulk terminal connected to ground supply rail; and
means of supplying said small offset voltage applied between bulk and source of said third MOSFET wherein said small offset voltage is a synapse weight control signal supplied externally to the circuit.

11. An apparatus as in claim 10, wherein said output means comprises:
a sixth MOSFET, being active load, having a source terminal connected to most positive supply voltage rail, drain and gate terminals each of which connected to said common for all synapses node that is source terminal of said first MOSFET, and bulk-terminal connected to most-positive supply voltage rail;
a seven MOSFET, forming a current mirror with said sixth MOSFET, having a source terminal connected to most positive supply voltage rail, gate terminal connected to said common for all synapses node, drain terminal connected to drain terminal of an eighth MOSFET, and bulk terminal connected to most positive supply voltage rail;
said eight MOSFET having source terminal connected to ground supply rail, gate and drain terminals each of which connected to drain terminal of said seventh MOSFET, and bulk terminal connected to ground supply rail;
a ninth MOSFET, forming a current mirror with said eighth MOSFET, having source terminal connected to ground supply rail, gate connected to gate of said eighth MOSFET, drain terminal, being output terminal of said output means, and a bulk terminal connected to ground supply rail.

12. An apparatus as in claim 11, wherein said output means, comprising said sixth, seventh, eighth, and ninth MOSFETs are common for all other synapse-, input-, and weight-control means, said means connected to said common for all synapses node, power and ground supply rails to form a neuron model with any number of synapse connections.

13. An apparatus as in claim 12, wherein said output means produce output current linearly proportional, within a certain range, to the sum of all currents through said synapse means connected to said common node wherein said output current is the drain current of said sixth MOSFET.

14. An apparatus as in claim 13, wherein said output means limit said output current from being linearly proportional outside said range wherein said limitation on the said range is due to:

one or more MOSFETs leaving their default mode of operation, or node voltages limited by power supply voltage range.

15. An apparatus as in claim 14, wherein said default mode of operation for said MOSFETs is:

linear, on-saturation for said first MOSFET, and saturation for second, third, fourth, fifth, sixth, seventh, eighth and ninth MOSFETs.

16. An apparatus as in claim 15, wherein said second, third, fourth, fifth, eighth and ninth MOSFETs are n-channel MOSFETs and said first, second, third, sixth and seventh MOSFETs are p-channel MOSFETs.

* * * * *